(12) United States Patent
Schieren

(10) Patent No.: US 10,349,541 B2
(45) Date of Patent: Jul. 9, 2019

(54) DEVICE FOR THE TOOL-FREE MOUNTING OF MODULES ON A TOP-HAT RAIL AND FOR THE DESTRUCTION-FREE, TOOL-FREE UNMOUNTING OF THE SAME

(71) Applicant: SKIDATA AG, Groedig/Salzburg (AT)

(72) Inventor: Juergen Schieren, Munich (DE)

(73) Assignee: SKIDATA AG, Grödig/Salzburg (AT)

( * ) Notice: Subject to any disclaimer, the term of this patent is extended or adjusted under 35 U.S.C. 154(b) by 734 days.

(21) Appl. No.: 14/936,839

(22) Filed: Nov. 10, 2015

(65) Prior Publication Data

US 2016/0135307 A1    May 12, 2016

(30) Foreign Application Priority Data

Nov. 12, 2014 (EP) ..................... 14192908

(51) Int. Cl.
*F16M 13/02* (2006.01)
*H05K 5/02* (2006.01)
*F16B 2/24* (2006.01)
*H02B 1/052* (2006.01)

(52) U.S. Cl.
CPC .......... *H05K 5/0204* (2013.01); *F16B 2/248* (2013.01); *F16M 13/022* (2013.01); *H02B 1/052* (2013.01); *Y10T 29/49826* (2015.01); *Y10T 29/49828* (2015.01)

(58) Field of Classification Search
CPC .... H05K 5/0204; H02B 1/052; F16M 13/022; Y10T 24/44923; Y10T 24/44949; Y10T 29/49828; A61C 7/12; A61C 7/20; F16B 2/248; F16B 2/20
See application file for complete search history.

(56) References Cited

U.S. PATENT DOCUMENTS

| | | | | |
|---|---|---|---|---|
| 788,672 A | * | 5/1905 | Perry ...................... | D06F 55/02 24/566 |
| 1,117,830 A | * | 11/1914 | Gamble .................. | D06F 55/02 24/566 |
| 1,894,906 A | * | 1/1933 | Henry, Jr. ................ | G09F 3/02 24/3.12 |

(Continued)

FOREIGN PATENT DOCUMENTS

| DE | 932847 C | 9/1955 |
|---|---|---|
| DE | 1590115 A1 | 5/1970 |

OTHER PUBLICATIONS

European Search Report dated May 4, 2015 of Corresponding EP Application No. 14 192 908.3.

*Primary Examiner* — Sarang Afzali
*Assistant Examiner* — Ruth G Hidalgo-Hernandez
(74) *Attorney, Agent, or Firm* — Davis & Bujold PLLC; Michael J. Bujold

(57) ABSTRACT

A device for the tool-free mounting of modules on a top-hat rail and for the damage-free, tool-free unmounting of the same. The device has a double leg spring, with a first leg coil spring and a second leg coil spring, which are arranged coaxially about a common spring axis. First and second spring legs of the double leg spring are dimensioned identically and in each case form a hook bent in the direction of an opposite end of the double leg spring. The double leg spring also has a common intermediate leg at another end, which leg forms a hook bent in the direction of a first end.

2 Claims, 6 Drawing Sheets

(56) References Cited

U.S. PATENT DOCUMENTS

| | | | | |
|---|---|---|---|---|
| 1,976,115 | A * | 10/1934 | Boyd | A61C 7/12 433/11 |
| 4,197,642 | A * | 4/1980 | Wallshein | A61C 7/30 433/11 |
| 4,260,375 | A * | 4/1981 | Wallshein | A61C 7/30 433/11 |
| 5,630,716 | A * | 5/1997 | Hanson | A61C 7/30 433/11 |
| 5,810,399 | A * | 9/1998 | Platano | F16L 37/1225 24/27 |
| 6,217,321 | B1 * | 4/2001 | Kanno | A61C 7/30 433/11 |
| 7,063,531 | B2 * | 6/2006 | Maijer | A61C 7/12 433/11 |

\* cited by examiner

DEVICE FOR THE TOOL-FREE MOUNTING OF MODULES ON A TOP-HAT RAIL AND FOR THE DESTRUCTION-FREE, TOOL-FREE UNMOUNTING OF THE SAME

BACKGROUND OF THE INVENTION

The present invention relates to a device for the tool-free mounting of modules on a top-hat rail and for the damage-free and tool-free unmounting of the same. Furthermore, the invention relates to a method of using such a device according to the invention for the tool-free mounting of modules on a top-hat rail and for the damage-free and tool-free unmounting of the same.

It is known from the prior art to mount modules, particularly electrical and electronic modules within a housing, on "top-hat rails". Top-hat rails are profile rails that are used, e.g., for fastening modules in distribution boxes, switch cabinets, vending machines and the like. Often, however, aside from the installation space for a module, there is barely room for the mounting, and particularly for mounting tools, available inside a device on which a top-hat rail is arranged.

SUMMARY OF THE INVENTION

A principal object of the present invention is to provide a device for the tool-free mounting of modules on a top-hat rail and for the damage-free, tool-free unmounting of the same, the use of which device makes it possible to mount and unmount a module quickly and reliably, even in the narrowest space. Furthermore, a method is desired for the tool-free mounting of modules on a top-hat rail and for the destruction-free, tool-free unmounting of the same by means of the device according to the invention.

This object, as well as other objects which will become apparent from the discussion that follows, are achieved by providing a device for the tool-free mounting of modules on a top-hat rail and for the damage-free, tool-free unmounting of the same, which includes a one-piece double leg spring, having a first leg coil spring and a second leg coil spring arranged coaxially about a common spring axis. At a first end of the double leg coil spring, a spring end of the first leg spring forms a first spring leg and a spring end of the second leg coil spring forms a second spring leg. These first and second spring legs are dimensioned identically and in each case form a hook bent in the direction of the other, second end of the double leg spring. The double leg spring has a common intermediate leg at the other, second end, which leg forms a hook bent in the direction of the first end.

The hooks at the first end of the double leg spring and the hook formed by the intermediate leg at the second end of the double leg spring protrude out of a plane on the same side formed by the straight parts of the double leg spring located between the leg springs and the common intermediate leg, wherein the two leg springs protrude out of this plane at the opposite side. The leg springs are realised in such a manner that the hooks at the first end of the double leg spring and the hook formed by the intermediate leg at the second end of the double leg spring can be pulled apart against the force of the leg springs.

To mount a module on a top-hat rail by means of the device according to the invention, the device is initially fastened on the module to be mounted in the context of premounting.

Here, the two leg springs and the first and second spring legs are in each case guided, with the leg springs at the front, through a first and second opening on the housing wall of the module facing the top-hat rail in the mounted state, wherein the two hooks formed by the first and second spring legs are respectively suspended in a third and a fourth opening of the housing wall of the module facing the top-hat rail in the mounted state above the first and second openings from the side of the housing wall facing away from the top-hat rail in the mounted state.

After the suspension of the hooks formed by the first and second spring legs, the hook formed by the intermediate leg protrudes out of the side, facing the top-hat rail in the mounted state, of the housing wall of the module facing the top-hat rail in the mounted state, as the housing wall located between the first and second openings prevents a movement of the hook in the direction of the housing interior.

Subsequently, in the context of the actual mounting step, in which the module is attached on the top-hat rail, initially a positive fit is produced between the hook formed by the intermediate leg and the lower end of the top-hat rail, wherein subsequently the module is pulled upwards against the force of the leg springs and pushed in the direction of the top-hat rail, until a projection bent downwards, i.e. in the direction of the intermediate leg, of the housing wall of the module facing the top-hat rail produces a positive-fitting connection with the upper end of the top-hat rail. The module is pulled downwards by the force of the leg springs, so that the positive-fitting connection between the projection and the upper end of the top-hat rail cannot be detached without a targeted external action, as a result of which the module is mounted on the top-hat rail.

In the mounted state, no or only a very small force advantageously acts on the double leg spring, as the weight is carried by the positive-fitting connection between the top-hat rail and the downwardly bent projection of the module and the hook formed by the intermediate leg is used for fixing the module by means of the positive-fitting connection with the lower end of the top-hat rail. The procedure is reversed for unmounting, so that the connection can be detached in a destruction-free and tool-free manner.

The mounting outlay is reduced considerably by means of the concept according to the invention for low production costs. As no tool is required, mounting is possible even in the narrowest spaces by means of simple movements of the module using the premounted double leg spring.

For a full understanding of the present invention, reference should now be made to the following detailed description of the preferred embodiments of the invention as illustrated in the accompanying drawings.

DETAILED DESCRIPTION OF THE PREFERRED EMBODIMENTS

Figure 1:
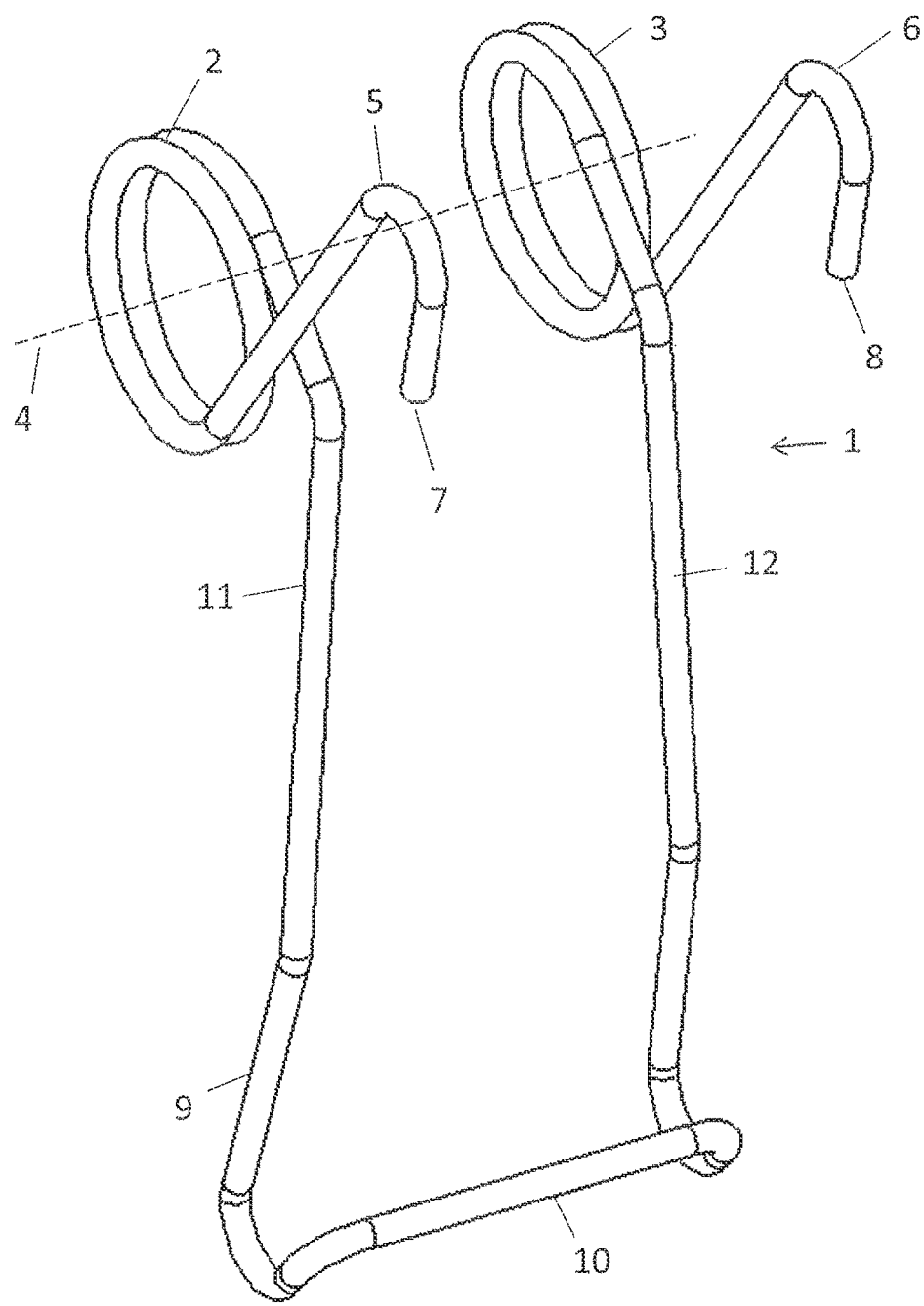
FIG. 1 shows a perspective view of a device according to the invention for a tool-free mounting of modules on a top-hat rail.
Figure 2:
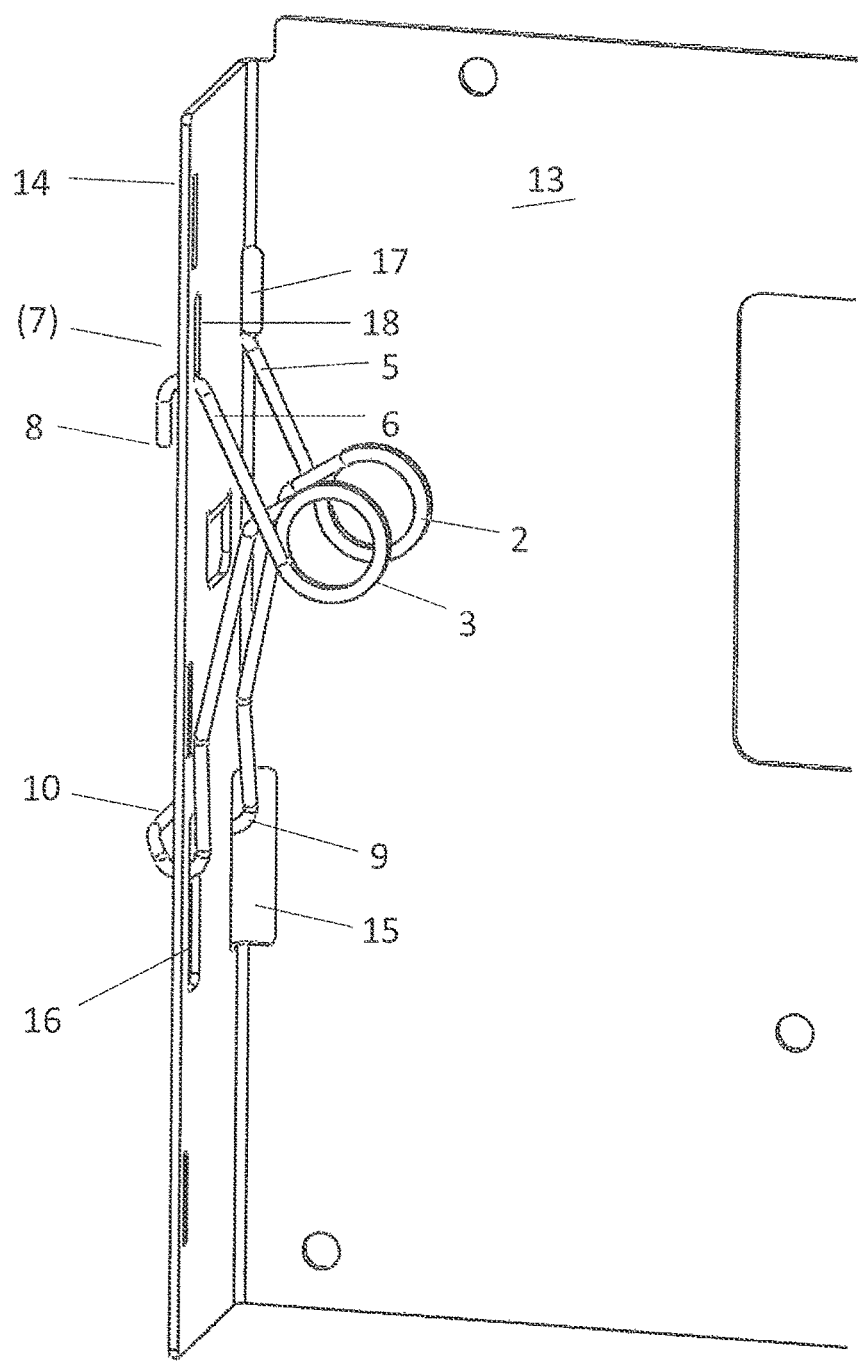
FIG. 2 shows a perspective schematic view of a part of the housing of a module to be mounted with a premounted device according to the invention, in a first step of a mounting method.

According to the invention and with reference to FIG. 1, the device for the tool-free mounting of modules on a top-hat rail and for the damage-free, tool-free unmounting of the same is realised as a preferably one-piece double leg spring 1, with a first leg coil spring 2 and a second leg coil spring 3, which are arranged coaxially about a common spring axis 4, wherein, at a first, and—in the examples shown in the figures—in the mounted state upper, end of the double leg spring 1, a spring end of the first leg spring 2 forms a first spring leg 5 and a spring end of the second leg spring 3 forms a second spring leg 6. The first and second spring legs 5, 6 are dimensioned identically and in each case form a hook 7, 8 bent in the direction of the other, second, and—in the examples shown in the figures—in the mounted state lower, end of the double leg spring 1.

As can be drawn from FIG. 1, the double leg spring 1 has a common intermediate leg 9 at the other, second end, which leg forms a hook 10 bent in the direction of the first end of the double leg spring 1.

The first and second hooks 7, 8 at the first end of the double leg spring 1 and the hook 10 formed by the intermediate leg 9 at the second end of the double leg spring 1 protrude out of a plane on the same side formed by the straight parts 11, 12 of the double leg spring 1 located between the leg springs 2, 3 and the common intermediate leg 9, wherein the two leg springs 2, 3 protrude out of this plane at the opposite side. Furthermore, the leg springs 2, 3 are realised in such a manner that the hooks 7, 8 at the first end of the double leg spring 1 and the hook 10 formed by the intermediate leg 9 at the second end of the double leg spring 1 can be pulled apart against the force of the leg springs 2, 3.

Preferably, the double leg spring 1 according to the invention is produced from spring steel, wherein the dimensioning and design of the double leg spring 1 are selected in accordance with the weight and the dimensioning of the module to be mounted.

The mounting of a module 13 by means of the double leg spring 1 according to the invent illustrated on the basis of FIGS. 2-6. To facilitate understanding, a part of the housing of the module 13 is illustrated, wherein the housing wall 14 facing the top-hat rail in the mounted state is illustrated transparently. Electronic components of the module 13 are illustrated schematically in FIGS. 3-6.

In a first step, the double leg spring 1 fastened on the module 13 to be mounted, wherein the two leg springs 2, 3 and the first and second spring legs 5, 6 are in each case guided, with the leg springs 2, 3 at the front, through a first and second opening 15, 16 on the side, facing the top-hat rail in the mounted state, of the housing wall 14 of the module 13 facing the top-hat rail in the mounted state, wherein the two hooks 7, 8 formed by the first and second spring legs 5, 6 are respectively suspended in a third and a fourth opening 17, 18 of the housing wall 14 of the module 13 facing the top-hat rail in the mounted state, as viewed in the mounted state above the first and second openings 15, 16 from the side of the housing wall 14 facing away from the top-hat rail in the mounted state.

After the suspension of the hooks 7, 8 formed by the first and second spring legs 5, 6, the hook 10 formed by the intermediate leg 9 protrudes out of the side, facing the top-hat rail in the mounted state, of the housing wall 14 of the module 13 facing the top-hat rail in the mounted state, as the part of the housing wall 14 located between the first and second openings 15, 16 prevents a movement of the hook 10 in the direction of the housing interior.

Figure 3:
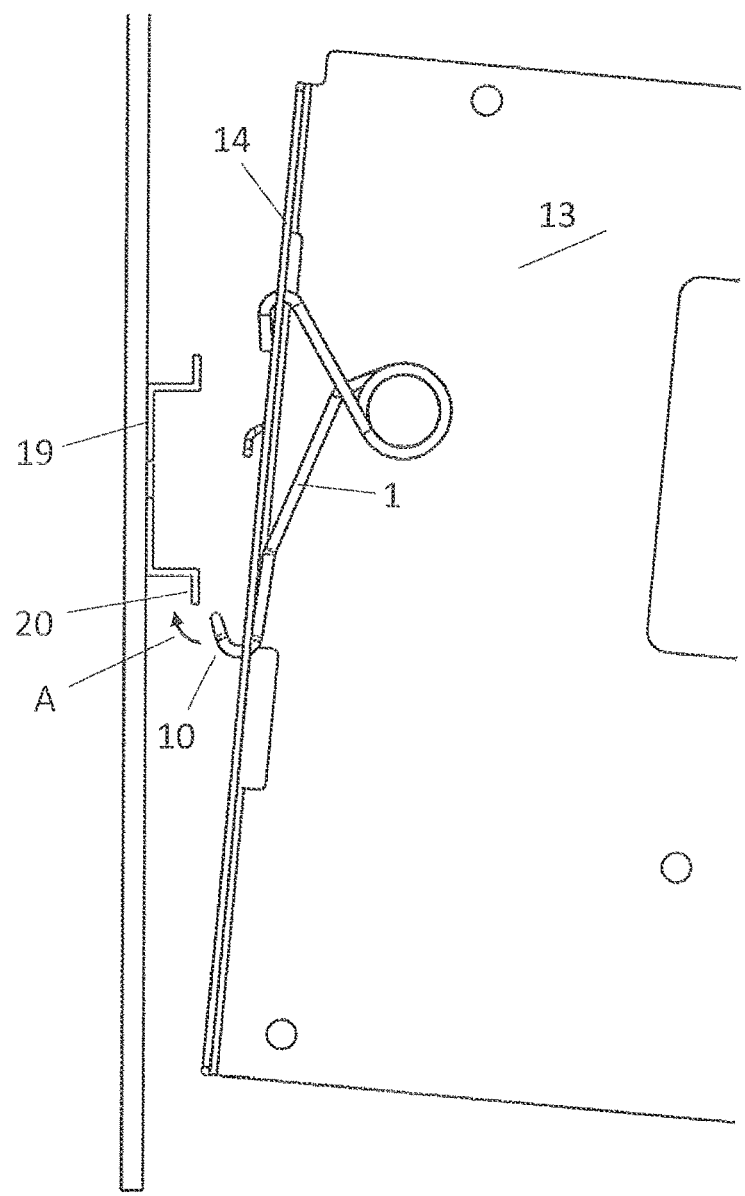
FIG. 3 shows the next step of the mounting method according to the invention.
Figure 4:
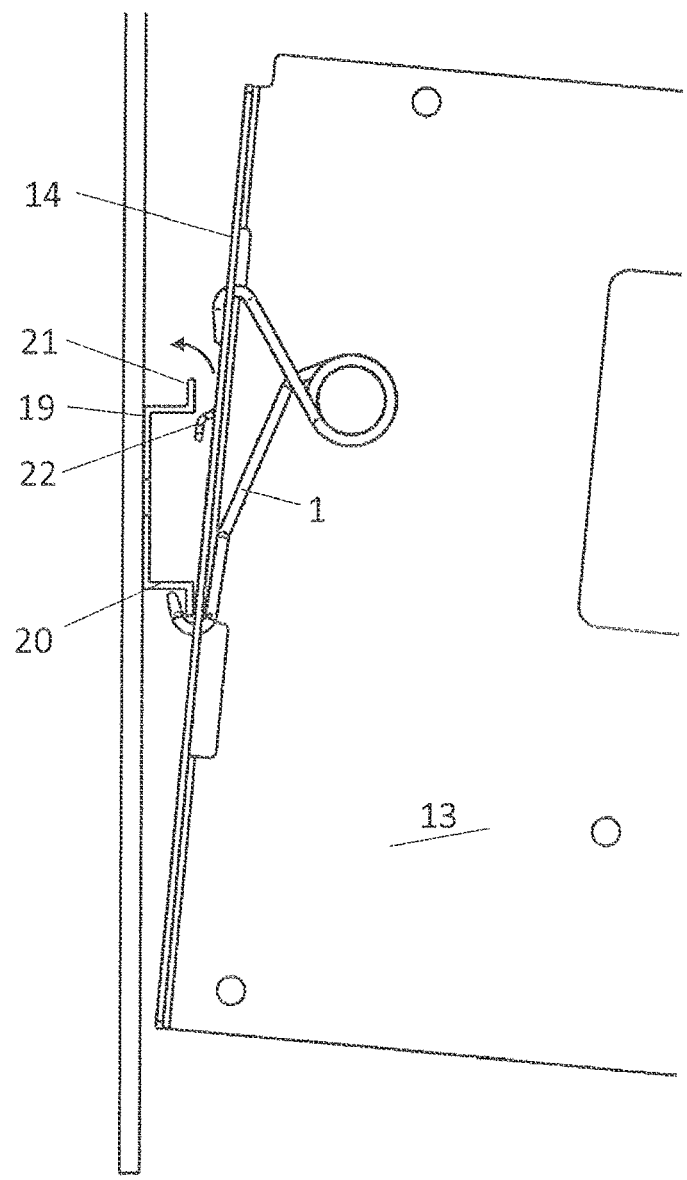
FIG. 4 shows a next step of the mounting method according to the invention.
Figure 5:
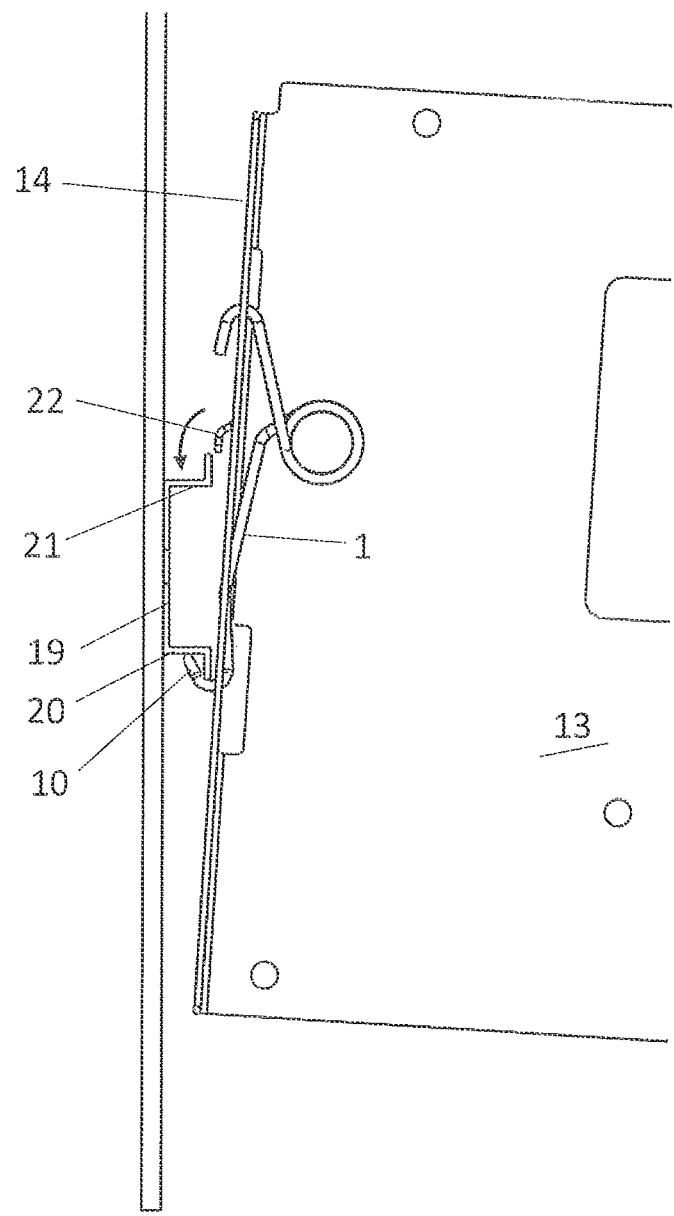
FIG. 5 shows a next step of the mounting method according to the invention.

In a next step, the module 13 as attached to the top-hat rail 19, in that as illustrated using FIG. 3 by means of the arrow A, initially a positive fit is produced between the hook 10 formed by the intermediate leg 9 and the lower end 20 of the top-hat rail 19, wherein subsequently and with reference to FIGS. 4 and 5, the module 13 is pulled upwards against the force of the leg springs 2, 3 and pushed in the direction of the top-hat rail 19, until a projection 22 bent downwards, i.e. in the direction of the intermediate leg 9, of the side, facing the top-hat rail 19 in the mounted state, of the housing wall 14 of the module 13 facing the top-hat rail produces a positive-fitting connection with the upper end 21 of the top-hat rail 19.

Figure 6:
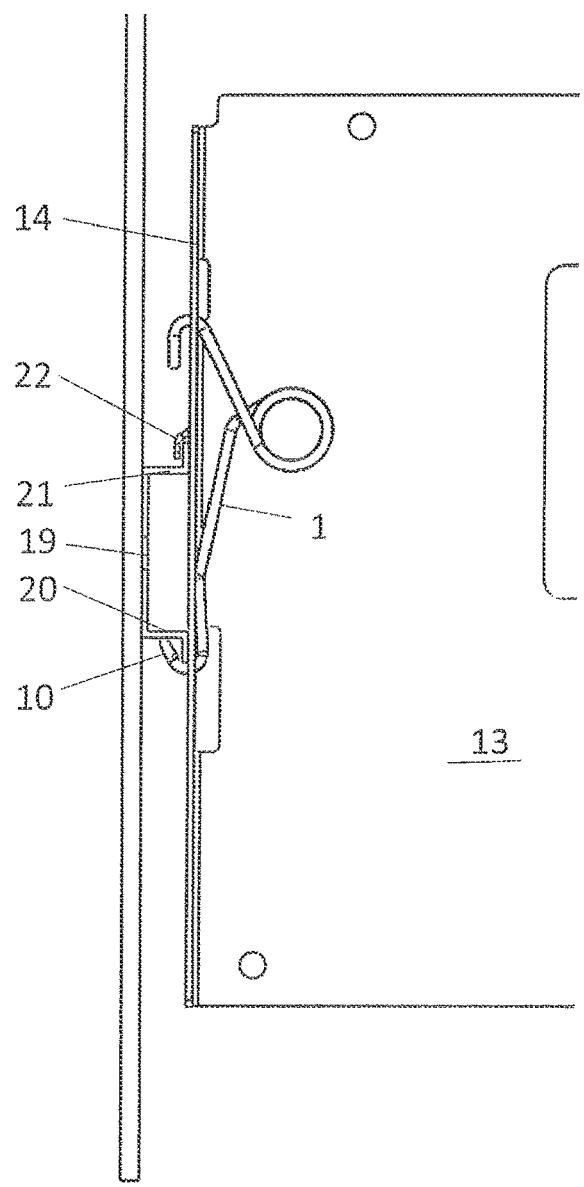
FIG. 6 shows a schematic side view of a module mounted on a top-hat rail by means of a device according to the invention.

The module is pulled downwards by the force of the leg springs 2, 3, so that the positive-fitting connection between the projection 22 and the upper end of the top-hat rail 19 cannot be detached without a targeted external action, as a result of which the module 13 is mounted on the top-hat rail 19, as illustrated on the basis of FIG. 6.

The unmounting of the module 13 takes place in reverse.

The position of the openings 15, 16, 17, 18 and the projection 22 of the side, facing the top-hat rail 19 in the mounted state, of the housing wall 14 of the module 13 facing the top-hat rail 19 in the mounted state, and the dimensioning of the double leg spring 1 are adapted to one another, in order to enable the mounting.

In the example shown, in the mounted state, no or only a very small force advantageously acts on the double leg spring 1, as the weight is carried by the positive-fitting connection between the top-hat rail 19 and the downwardly bent projection 22 of the housing wall 14 of the module 13 facing the top-hat rail 19 in the mounted state, and the hook 10 formed by the intermediate leg 9 is used for fixing the module 13 by means of the positive-fitting connection with the lower end 20 of the top-hat rail 19.

Alternatively, the double leg spring 1 and the module or the housing wall 14 of the module 13 facing the top-hat rail 19 in the mounted state can be mounted rotated through 180° relatively to the top-hat rail 19, wherein in this case, the weight is carried by the hook 10 formed by the intermediate leg 9, which is connected in a positive-fitting manner to the upper end 21 of the top-hat rail 19, and a positive-fitting connection in the lower region between the projection 22 of the housing wall 14 of the module 13 facing the top-hat rail in the mounted state and the lower end of the top-hat rail 19 is used for fixing the module 13.

There has thus been shown and described a novel device for the tool-free mounting of modules on a top-hat rail and for the damage-free, tool-free unmounting of the same, and a method for using the device which fulfills all the objects and advantages sought therefor. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention, which is to be limited only by the claims which follow.

What is claimed is:

1. A device for tool-free mounting of modules on a top-hat rail and for damage-free, tool-free unmounting of the modules from the top-hat rail, said device comprising:

a double leg spring having a first leg coil spring and a second leg coil spring arranged coaxially about a common spring axis;

wherein, at a first end of the double leg spring, a spring end of the first leg coil spring forms a first spring leg and a spring end of the second leg coil spring forms a second spring leg;

the first spring leg and the second spring leg are dimensioned identically to each other and each of the first spring leg and the second spring leg forms a hook bent in a direction of an opposite, second end of the double leg spring;

the double leg spring has a common intermediate leg at the second end, which forms a hook bent in a direction of the first end;

the first and second hooks of the first spring leg and the second spring leg at the first end of the double leg spring and the hook formed by the intermediate leg at the second end of the double leg spring protrude out of a plane on a same side of the double leg spring, formed by straight parts of the double leg spring located between the first leg coil spring and the second leg coil spring and the common intermediate leg;

the first leg coil spring and the second leg coil spring protrude out of the plane at an opposite side, and the first leg coil spring and the second leg coil spring are configured such that the first and second hooks of the first spring leg and the second spring leg at the first end of the double leg spring and the hook formed by the intermediate leg at the second end of the double leg spring can be pulled apart against a force of the first leg coil spring and the second leg coil spring.

2. The device according to claim 1, for the tool-free mounting of modules on the top-hat rail, wherein the double leg spring is produced from spring steel.

* * * * *